United States Patent [19]

Perusse

[11] Patent Number: 5,134,320
[45] Date of Patent: Jul. 28, 1992

[54] HIGH EFFICIENCY FET DRIVER WITH ENERGY RECOVERY

[75] Inventor: Eugene T. Perusse, San Diego, Calif.

[73] Assignee: Hughes Aircraft Company, Los Angeles, Calif.

[21] Appl. No.: 666,096

[22] Filed: Mar. 7, 1991

[51] Int. Cl.$^5$ .............................................. H03K 17/687
[52] U.S. Cl. ................................... 307/571; 307/581; 307/584; 307/633; 328/67
[58] Field of Search ................ 307/571, 581, 584, 633; 328/67

[56] References Cited

U.S. PATENT DOCUMENTS 4,873,460  10/1989  Rippel ................................ 307/584
5,010,261   4/1991  Steigerwald ....................... 307/584

Primary Examiner—Eugene R. LaRoche
Assistant Examiner—Michael B. Shingleton
Attorney, Agent, or Firm—Wanda K. Denson-Low

[57] ABSTRACT

A circuit incorporating a circuit element for recovering the energy stored in the parasitic input capacitance of a power transistor at turn-on. The circuit includes a resonating element, such as a transformer, and a diode coupled between a voltage source and a power transistor, such as a field effect transistor. A switching device is switchably coupled between the input of the power transistor and the voltage source, and between the input of the power transistor and the resonating element. The resonating element is adapted to recover and store the energy stored in the parasitic capacitance of the power transistor when it is turned on, thus improving the efficiency of the circuit. The diode is adapted to avoid loading of the power source. The energy is recovered and stored until a new turn-on interval is required or until there is a need for other power requirements. This improves the operating efficiency of a system using the circuit. For a given loss, the recovery of this energy permits operation at a higher frequency for size reduction and/or improved performance, or the use of large die for reduced conduction loss. The advantages are the same for FETs when they are used as the control element or as a rectifier element, but the gains in efficiency are most notable in rectifier applications.

7 Claims, 1 Drawing Sheet

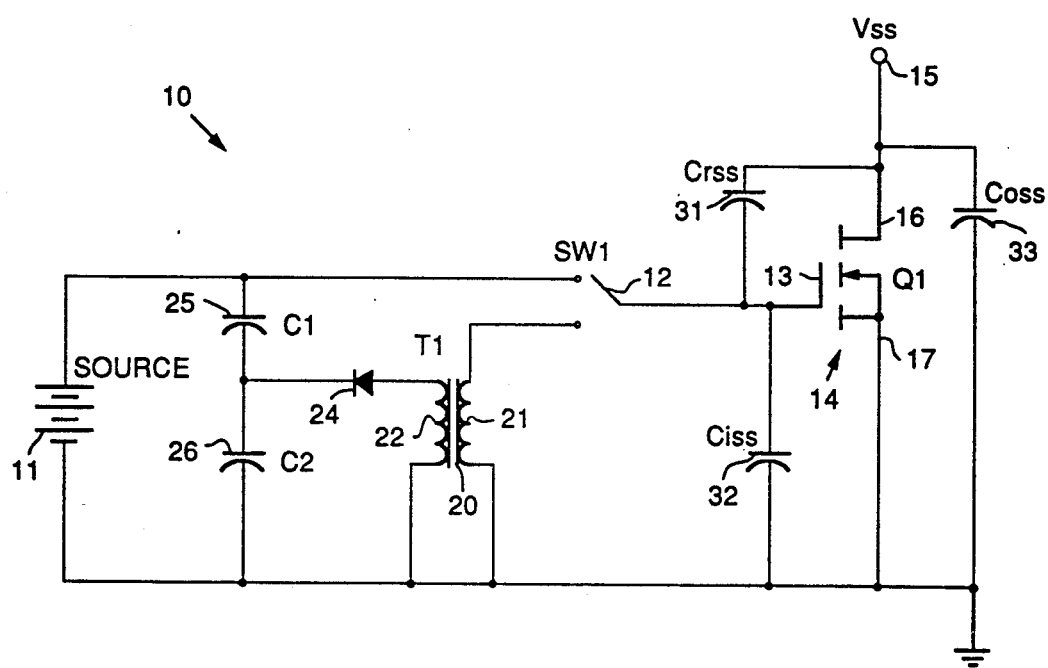

HIGH EFFICIENCY FET DRIVER WITH ENERGY RECOVERY

BACKGROUND

The present invention relates generally to power conversion systems and methods, and more particularly, to a circuit arrangement for recovering the energy stored in the input capacitance of a field effect transistor that is used to turn it on.

There is a continuing need to improve the efficiency of electronic equipment. This need comes from the continued size reduction of electronic equipment being accomplished through high level integration and hybrid technologies. In the field of power conversion there also exists an increasing demand for smaller more efficient power conversion methods. To improve the density of power converters it is necessary to increase the conversion frequency. Since one of the main contributors to low efficiency in low voltage (1 to 5 volts) power converters is the rectifier loss, FETs are the most likely candidates for use as both a control element and as the rectification element in high frequency density power converters. FETs contribute a loss that is caused by the charging of its input capacitance and by an ohmic conduction loss. The charging loss increases directly with frequency and with the physical die size of the FET. A large die size is required to minimize the ohmic conduction losses caused by the FET.

The present state of the art typically removes the energy stored in the input capacitance of a FET by discharging the capacitance in a resistive element. The energy is lost as heat. A paper published by staff members of Virginia Polytechnic Institute and State University has described a means of resonantly charging the input capacitance of FETs to improve turn on. This paper is entitled "Zero-Voltage-Switched Quasi-Resonant Buck and Flyback Converters - Experimental Results at 10 MHz", authored by W. A. Tabisz, Gradzki, and F. C. Lee, 1987 IEEE Proceedings of the Power Electronics Specialists Conference. A NASA Tech Brief, Vol. 14, No. 5, entitled "Recovering Energy From a Rapidly Switched Gate also discussed efficiently charging and discharging gate capacitance. However, these references do not discuss recovery of the energy stored in FET input capacitance at turn-off.

More specifically, there is an ever increasing need in radar and communication systems and in automotive applications to improve the performance while reducing the size and weight and improving the efficiency of power conversion equipment. This is conventionally accomplished in part by operating power conversion equipment at higher operating frequencies than is typical of conventional equipment. It is therefore an objective of the present invention to by providing a means of recovering the energy stored in the input capacitance of a power transistor by its turn-on signal.

SUMMARY OF THE INVENTION

The present invention provides a means of recovering the energy stored in the parasitic input capacitance of a field effect transistor (FET) at turn-on of the device. This energy may be recovered and stored until a new turn-on interval is required or until there is a need for other power requirements. This improves the operating efficiency of a system using the circuit. For a given loss, the recovery of this energy permits the operation at higher frequency for size reduction and/or improved performance, or the use of larger die for reduced conduction loss. The advantages are the same for FETs when they are used as the control element or as a rectifier element, but the gains in efficiency are most noticeable in low voltage rectifier applications.

More specifically, the present invention comprises a power transistor circuit that includes a voltage source having an input capacitor coupled thereacross. A resonating element, such as a transformer, is provided to recover the normally lost energy. A diode is coupled between the resonating element and the input capacitor to isolate the power source. An input of a power transistor, such as a field effect transistor having a gate input, is coupled between a power source and ground and is adapted to provide switched output power in response to triggering of its gate input. A switching device is switchably coupled between the input of the power transistor and the voltage source, and between the input of the power transistor and the resonating element. The resonating element and diode provide a means for recovering and storing the energy stored in the parasitic capacitance of the power transistor when it is turned on, thus improving the efficiency of the circuit.

BRIEF DESCRIPTION OF THE DRAWINGS

The various features and advantages of the present invention be more readily understood with reference to the following detailed description taken in conjunction with the accompanying drawing, wherein like reference numerals designate like structural elements, and in which the sole FIGURE shows an embodiment of an FET driver circuit that illustrates the principles of the present invention.

DETAILED DESCRIPTION

Referring to the drawing FIGURE, a power transistor circuit 10 is shown that includes a power source 11 that applies voltage through a switch 12 to a base 13 of a field effect transistor (FET) 14 that is coupled between a voltage source (VSS) 15 and ground. The switch 12 is switchably coupled to the primary winding 21 of a resonant element 20, or a transformer 20, whose secondary winding 22 is coupled through a diode 24 to a point between two capacitors 25, 26 coupled across the power source 11. Two parasitic capacitances 31, 32 ($C_{rss}$, $C_{iss}$) are shown coupled between the gate 13 and the drain 16 and the gate 13 and the source 17, respectively, of the transistor 14, while an output parasitic capacitance 33 ($C_{oss}$) is shown coupled between the source 17 and the drain 16, and hence across the output of the transistor 14.

The parasitic capacitors 31, 32 ($C_{rss}$, $C_{iss}$) provide the need for the present invention. To turn on the field effect transistor 14, it is necessary to charge its input capacitance comprising the two parasitic capacitors 31, 32 ($C_{iss}$ plus $C_{rss}$). In some applications the effective value for $C_{rss}$ is increased hundreds of times due to the well-known Miller effect. For effective and efficient operation, the voltage at the gate 13 of the FET 14 must be driven from a voltage of zero or slightly negative to a positive value approaching twenty volts. The power required to charge the input capacitance increases directly with the frequency ($\frac{1}{2}*CE^2f$) the FET transistor 14 is turned on and by the size of the FET die. Therefore the need for the present invention increases as the state of the art pushes the need for higher frequency and higher power converters.

To turn the FET 14 on, the switch 12 is in the position shown applying a voltage from the power source 11 stored in the two capacitors 25, 26 (15 volts typical) to the gate 13 of the FET 14. When it is desired to turn off the FET 14 the switch 12 is transferred to the other position connecting the transformer 20 to the gate 13 of the FET 14 providing a path to return the energy stored in the input capacitance (parasitic capacitor 32) to the voltage source 11. The transformer 20 is typically a current transformer which can supply a very low impedance to the gate 13 of the FET 14 while maintaining a low (near zero) voltage at the gate 13 of the FET 14. The switch 12 is shown for simplicity as a conventional switch. In practical implementations the switch 12 may be any electrical or electronic switching device such as but not limited to bipolar or field effect transistors. The power source 11 is shown as a battery, but may be any source of electrical power. It is not a requirement of the present invention that the input capacitors 25, 26 be series connected. The input capacitors 25, 26 may be isolated and the energy transferred to the second input capacitor 26 from the gate 13 of the FET 14 used to supply any load requiring a source of energy.

The advantages of the circuit 10 of the present invention are as follows. As density of power converters is increased the need for operating at higher and higher conversion frequency become more and more important to reduce the size of magnetic and capacitive energy storage and coupling devices. Work is presently under way to develop multi-megahertz power converters to meet the higher density goals. As the density increases the problem of heat removal also increases, therefore there is the need for higher efficiency.

For example, if we use for a base line a 3 volt 100 watt converter, with requirements that the density is greater than 100 watts per cubic inch and its efficiency is greater than 90 percent, the total permitted loss is approximately 11 watts. If we choose to operate at 10 Mhz with two rectifier device and one controlled switching device, and we select a SMM70N06 FET for these three applications. (Known diodes with their 0.6 to 0.75 volt drop are not satisfactory because 0.6 volts out of 3 volts already reduces the efficiency to 90%). The input capacitance of the SMM70N06 is 5200 picofarads. The power in watts required to charge the device capacitance is given by: $W = \frac{1}{2}*CE^2f$, where C is the effective input capacitance, E is the voltage to which the input capacitance is charged typically 10 to 15 volts, f is the repetition frequency at which the capacitance is charged. Therefore, $W = \frac{1}{2}*5.2*10^{-9}*15^2*10*10^6 = 5.8$ watts for one device, and $=17.55$ watts for three devices.

If only half of this energy is recovered, a significant gain is realized in reaching the goal of total loss of less than 11 watts. Also note we have not included the effect of the Miller capacitance, which may be significant loss contributor, in this example.

The resonating element 20 (inductance), or transformer 20, is needed to make the circuit 10 work. At the operating frequencies that the circuit 10 is anticipated to be advantageous the parasitic inductances of the transformer 20 and wiring associated therewith are adequate to provide the needed inductance for the circuit 10. For example, if the discharge path is resonated at ten times the operating frequency of 10 MHz (100 Mhz) for a half cycle time of 5 nanoseconds, less than 0.5 nanohenrys is required. In the circuit 10, the diode 24 is employed between the input capacitors 25, 26 and the transformer 20. This diode 24 provides for a unidirectional switch to isolate the transformer 20 from the input storage capacitor 26 between discharge cycles.

Thus there has been described a new and improved circuit arrangement for recovering the energy stored in the input capacitance of a field effect transistor that is used to turn it on. It is to be understood that the above-described embodiment is merely illustrative of some of the many specific embodiments which represent applications of the principles of the present invention. Clearly, numerous and other arrangements can be readily devices by those skilled in the art without departing from the scope of the invention.

What is claimed is:

1. A power transistor circuit comprising:
   a voltage source;
   two serially coupled capacitors coupled across the voltage source;
   a resonating element;
   a power transistor having a control input and having a parasitic capacitance, which transistor is coupled between a power source and ground;
   a switching device switchably coupled between the control input of the power transistor and the voltage source, and between the control input of the power transistor and the resonating element;
   whereby the resonating element provide a means for recovering and storing the energy stored in the parasitic capacitance of the power transistor when it is turned on, thus improving the efficiency of the circuit.

2. The power transistor circuit of claim 1 which further comprises:
   a diode coupled between the transformer and the two serially coupled capacitors.

3. The power transistor circuit of claim 1 wherein the power transistor comprises a field effect transistor.

4. The power transistor circuit of claim 3 wherein the field effect transistor has a gate input that is coupled to the switching device.

5. The power transistor circuit of claim 1 wherein the resonating element comprises a transformer having a primary winding and a secondary winding, and wherein the switching device is switchably coupled between the control input of the power transistor and the primary winding of the transformer.

6. A field effect transistor circuit comprising:
   a voltage source having a ground;
   two input capacitors serially coupled across the voltage source;
   a transformer having a primary winding and a secondary winding;
   a diode coupled between a second terminal of the primary winding of the transformer and a point between the two input capacitors;
   a field effect transistor having a gate and a parasitic capacitance, which transistor is coupled between a power source and ground;
   a switching device switchably coupled between the gate of the field effect transistor and the voltage source, and between the gate of field effect transistor and a second terminal of the secondary winding of the transformer;
   whereby the transformer and diode provide a means for recovering and storing the energy stored in the parasitic capacitance of the field effect transistor when it is turned on, thus improving the efficiency of the circuit.

7. A field effect transistor circuit comprising:

a voltage source having a ground;

two input capacitors serially coupled across the voltage source;

a transformer having a primary winding and a secondary winding, and having one terminal of the primary and secondary windings connected to ground;

a diode coupled between a second terminal of the primary winding of the transformer and a point between the two input capacitors;

a field effect transistor having a gate and a parasitic capacitance, which transistor is coupled between a power source and ground;

a switching device switchably coupled between the gate of the field effect transistor and the voltage source, and between the gate of field effect transistor and a second terminal of the secondary winding of the transformer;

whereby the transformer and diode provide a means for recovering and storing the energy stored in the parasitic capacitance of the field effect transistor when it is turned on, thus improving the efficiency of the circuit.

* * * * *